United States Patent [19]

Kojima et al.

[11] Patent Number: 4,833,985
[45] Date of Patent: May 30, 1989

[54] APPARATUS FOR MATCHING REGISTER MARKS AND PUNCHING U-HOLES FOR PRESS PLATE

[75] Inventors: Yasutaka Kojima; Yuhki Watanabe, both of Tokyo, Japan

[73] Assignees: Akiyama Printing Machinery Manfacturing Corp.; Kamo Denki Research Institute Ltd., both of Tokyo, Japan

[21] Appl. No.: 153,230

[22] Filed: Feb. 8, 1988

[30] Foreign Application Priority Data

Feb. 12, 1987 [JP] Japan ................................ 62-028050

[51] Int. Cl.⁴ ................................................ B41C 1/00
[52] U.S. Cl. ........................ 101/401.1; 101/DIG. 36
[58] Field of Search ...................... 101/401.1, 426, 383, 101/382 R, DIG. 12

[56] References Cited

U.S. PATENT DOCUMENTS 2,986,598  5/1961  Hell ................................. 101/401.1
3,062,140  11/1962  Bishop ............................ 101/401.1
3,160,096  12/1964  Norton ........................... 101/401.1
3,288,063  11/1966  Bungay, Jr. ..................... 101/401.1
4,380,956  4/1983  Elworthy ........................ 101/401.1
4,640,612  2/1987  Watanabe et al. ..................... 355/87

Primary Examiner—Eugene H. Eickholt
Attorney, Agent, or Firm—Rosen, Dainow & Jacobs

[57] ABSTRACT

The present invention relates to an apparatus for matching register marks and punching U-holes for a press plate which is capable of executing regular print by single register mark matching, and is composed of a press plate loading table for loading a press plate material, a pin hole positioning mechanism for supporting the lower edge of said press plate material, a press plate material centering mechanism for centering said press plate material in the horizontal direction, a register mark location reading device for reading register marks on said press plate material, a press plate material horizontal and vertical feed mechanism for adjusting said press plate material in the horizontal and vertical directions, a press plate locking device for vacuum contacting and releasing said press plate material, an automatic U-hole punching mechanism for punching a pair or two pairs of U-holes of predetermined pitches on said plate material, and an operation device for controlling the operation of each mechanism.

5 Claims, 3 Drawing Sheets

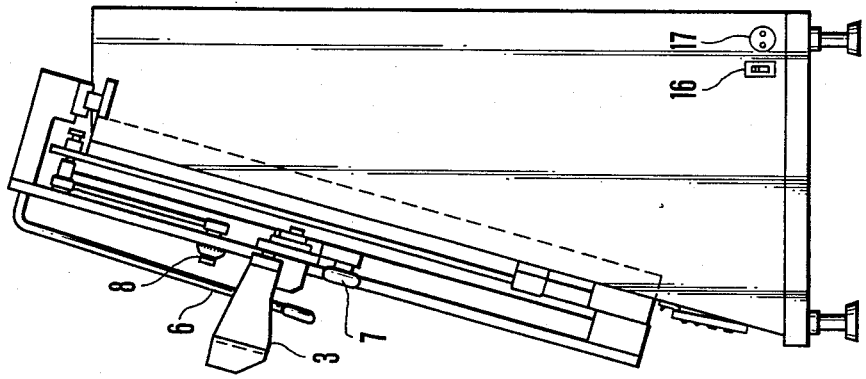
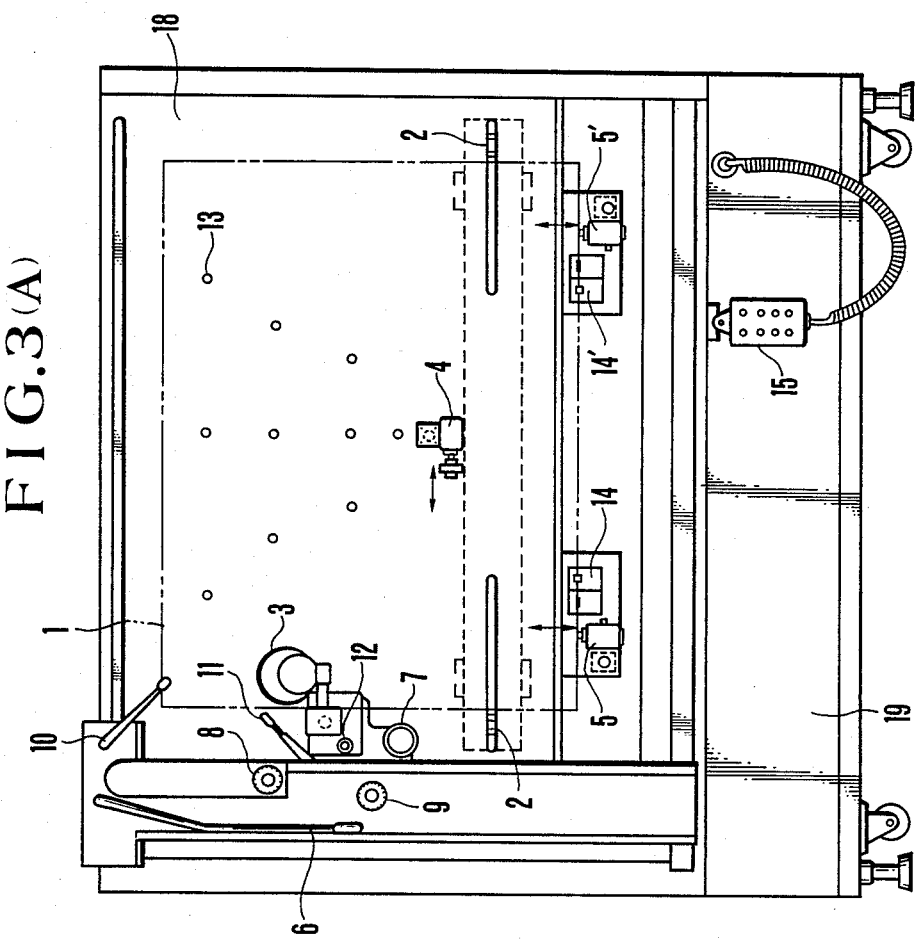

APPARATUS FOR MATCHING REGISTER MARKS AND PUNCHING U-HOLES FOR PRESS PLATE

BACKGROUND OF THE INVENTION

The present invention relates to an apparatus for matching register marks and punching U-shaped holes for a press plate which is capable of initiating regular printing by a single register mark matching, after setting a press plate for photomechanical process in the multicolor printing machine.

In FIG. 1, there is shown a press plate material (PS plate) in the prior art on which register marks 20 for a photomechanical process is drawn and a pair of pin holes 21, 22 which are punched therein. The register marks 20 are drawn by a vertical automatic register mark drawing device (not shown) at the four locations show, that is, on the right, left, upper and lower edges of an image on the press plate material. The press plate material is loaded on a press plate material loading table and then is centered in the horizontal direction by a centering mechanism, and thereafter it is vacuum contacted to and locked on the press plate loading table through a plurality of air suction holes provided in the loading table. Thereafter, register marks are drawn along a guide by a register mark drawing pen holder in accordance with the size of the press plate material. A pair of pin holes 21 and 22 are punched at the same time. The first pin hole 21 is a standard hole, whereas the second pin hole 22 is a longitudinal hole provided with clearance.

FIG. 2 also illustrates the prior art wherein one end of the press plate materials 1 for each color on which register marks are drawn are inserted into a vice 25 provided on a body 27 of a multicolor printing machine in a direction shown by an arrow a, and after one side of the vice 25 is rotated closed as shown by an arrow b, its end is positioned on the body 27, and then this end of the press plate material is locked on the body 27 of the multicolor printing machine by screws or the like (not shown). Thereafter, the free end of the press plate material 23 is wound around and locked on the body 27 as shown by an arrow c, whereby the press plate is set against the body 27. These procedures are executed for the press plate materials for each color and thus the necessary conditions to start multicolor printing are completed.

In the prior art, at the time of photographically printing the images on an original plate of film on the press plate material, register marks are drawn by a pen or the like on a ground paper on the press plate material and then the register marks on the original film plate are positioned over these register marks, and then printing is done whereby the press plate material is made.

This prior art method of drawing register marks on the press plate material has a disadvantage when the locations of the register marks of each color press plate material used for multicolor printing differ with respect to each other due to location shear caused when the press plate material is loaded on its ground paper. Such location shears can be caused by the pen being angled when register marks are drawn on the press plate material, errors caused by line of sight misalignment through the loop when the register marks of the original film plate are matched to the register marks of the press plate material, mechanical error and the like. Accordingly, the discrepancy in the register marks of the press plate material made as described above is caused when printing is done as indicated above and, as a result of it, it takes a great deal of time to set and locate them on the printing machine without causing color shears of the images. Furthermore, the prior art has additional disadvantages such that the operational efficiency of such a printing machine is extremely low since a number of trial printings have to be made in order to obtain final matching of the images each time the press plate material is changed; as a result, the several hundred sheets of papers are needed every time the press plate material is changed.

SUMMARY OF THE INVENTION

Accordingly, an object of the present invention is to provide an apparatus for matching register marks and punching U-shaped shaped holes for a press plate, which is able to precisely register with the register marks of the press plate material for multicolor printing and to punch U-shaped holds at a printing house immediately before any printing by the multicolor printing machine takes place.

An apparatus for matching register marks and punching U-shaped holes for a press plate in the present invention includes, in order to overcome the aforementioned disadvantage, a register mark location reading device for reading the location of register marks of the original film plate and the location of register marks of the press plate material in the same plane, left, right, upper and lower fine press plate material adjusting device for finely adjusting the locations of left, right, top and bottom register marks, and a punching device for punching a pair of U-shaped holes to properly set the press plate material on the printing machine.

An apparatus for matching register marks and punching U-shaped holes for a press plate in the present invention determines the center of the press plate material loaded on the press plate material loading table in the horizontal direction by a centering mechanism, reading the location of left side register mark of the press plate material prepared in accordance with the scale of a reading device, moving the reading device horizontally while the scale is fixed and then reading the location of the right side register mark of the press plate material by the reading device, calculating the error, and eliminating errors of the left and right side register marks by operating a fine adjusting device provided on both left and right sides of the upper and lower portions of the press plate material. First, the location of the left side register mark may be read and then the right side register mark may be read. Then upper and lower register marks are matched to the center of the press plate material by the fine adjustment device and thereafter the press plate material is vacuum contacted and locked on the press plate loading table, and then a pair of U-shaped holes are punched on the lower edge of the press plate material by the punching device.

BRIEF DESCRIPTION OF THE DRAWINGS

For the purpose of illustrating the invention, there is shown in the accompanying drawings a preferred embodiment, it being understood that the invention is not intended to be limited to the particular arrangement as shown therein.

DESCRIPTION OF THE PREFERRED EMBODIMENT

Figure 1:
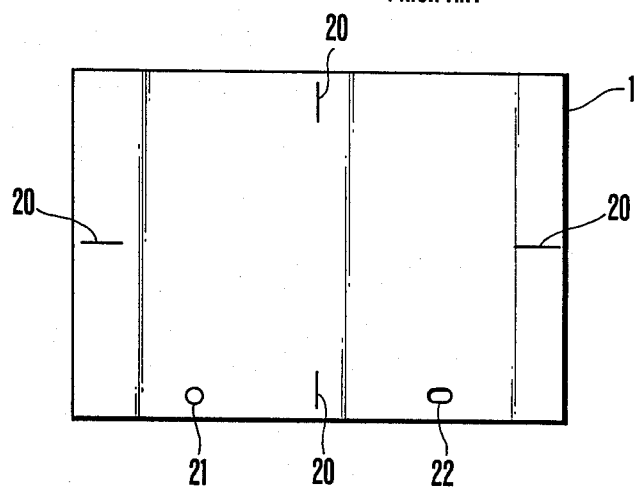
FIG. 1 illustrates a press plate in the prior art.
Figure 2:
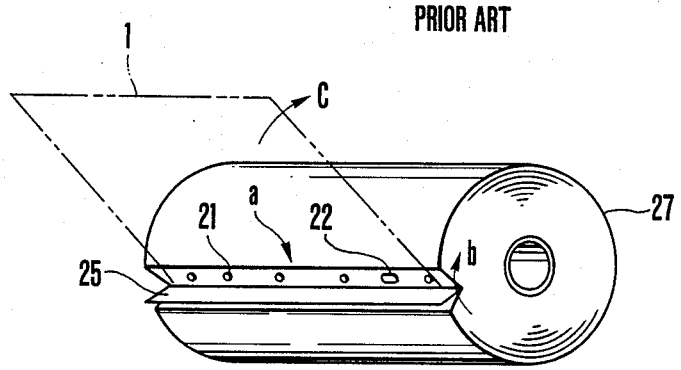
FIG. 2 illustrates the setting of a press plate into a body of a conventional printing machine, FIG. 3(A) and 3(B), respectively, are a front view and a side view of a preferred embodiment of an apparatus for matching register marks and punching U-shaped holes for a press plate of the present invention.

FIG. 3(A) is a front view of the preferred embodiment of an apparatus for matching register marks and punching U-shaped holes for the press plates of the present invention. FIG. 3(B) is a side view of the same apparatus. A table 19 of the present apparatus is provided with a hook for an operation box 15, a breaker 16, a plug socket 17 for an electric power source, and further includes a press plate loading table 18 at its upper end. An X axis and Y axis feed mechanism is slidably disposed, with a roller on the upper edge of the press plate loading table 18, which it overhangs. The X axis feed mechanism comprises an X axis moving lever 6 for feeding and locking in the horizontal (X axis) direction, and an X axis differential dial 8, an X axis locking lever 10 for a register mark location reading device. The Y axis feed mechanism comprises a Y axis moving knob 7 for feeding and locking in the vertical (Y axis) direction, a Y axis differential dial 9 and a Y axis locking lever for a register mark location reading device. The X axis and Y axis feed mechanism can be operated manually in both X and Y axes directions and can be precisely manually fed by means of a rack and pinion mechanism, timing pulley and a timing belt mechanism. The scale of the X axis and Y axis differential dials 8 and 9 is with a 0.05 mm notches. A register mark location reading device 3 is movably attached to the aforementioned feed mechanism. The reading device 3 comprises a projector which focuses by a focus differential dial 12, the accuracy of which reading is up to 2/100 mm. The reading device 3 also comprises a charge coupled device type (CCD) detector device with a monitor display or a two axes digital counter device using a magnetic scale to provide the absolute origin. A centering mechanism 2 includes a rack and pinion mechanism which determines the center of a press plate material 1 in the X axis manually by one touch operation. Both fine right and left press plate material moving device 4 and a fine upper and lower press plate material moving device 5,5' may be operated by the buttons on the operation box 15 while an operator is looking into the projector. The fine right and left moving device 4 can precisely move the entire centering mechanism 2 and the fine upper and lower moving device 5,5' can precisely move the left and right sides of the press plate material 1, respectively, by stepping motors (not shown) in increments on the order of 1/000 mm, to thereby match register mark locations. Vacuum suction holes 13 are provided at ten separate placed and at approximately 20 to 30 mm above the location of the punching devices 14, 14' disposed on the press plate material loading table 18. They are used to vacuum contact the press plate material to the table 18 by means of a vacuum pump (not shown) before operating the punching devices 14,14'. These punching device 14,14' are of the linear head pressurized type with a chip suction apparatus, and the distance of the U-shaped holes can be selected, step by step, from 425 mm, 600 mm and then to 780 mm. The operation box 15 can be hung on a hook provided on the lower end of the press plate material loading table 18 when it is not in use.

The operation of the apparatus for matching register marks and punching U-shaped holes for a press plate of the present invention is explained as follows. First, a pair of pin holes are punched and register marks are drawn on the press plate material 1 and then the press plate material 1 is put on the loading table 18 with its bottom edges contacting the fine upper and lower moving device 5,5'. The press plate material 1 is manually centered in the horizontal direction and its position is fixed by means of the X axis centering mechanism 2. Next, the location of the left side register mark of the press plate material 1 is read on the numerical scale as a distance, that is, its distance from the counter of the punch hole in the left side punch mechanism 14 is determined by the register mark location reading device 3 using the Y axis moving knob 7 and Y axis differential dial 9. While keeping this scale fixed, the register mark location reading device 3 is slidably moved in the horizontal direction and the location of the right side register mark of the press plate material 1 is read by the scale as a distance from the center of the punch hole in the right side punch mechanism 14' and then the distance error between the left side register mark and the right side register mark is calculated. The horizontal location error of the right and left register marks for the center location between the right and left punch hole is eliminated through the adjustment of the location of the right register mark in the upper or lower direction by operating the fine right side moving device 5' in the upper or lower direction by pushing the buttons of the operation box 15. When the error in the horizontal location is eliminated the X axis position of the press plate material 1 will be locked by the X axis locking lever 10. As mentioned above, the right side register mark location is adjusted on the basis of the left side register mark location, but, on the other hand, the left side register mark location may be adjusted on the basis of the right side register mark location.

Then the register mark location reading device 3 is moved to the center of the pair of pin holes, that is, the pin pitch center of the lower edge of the press plate material 1 and the location of the register mark of the press plate material 1 in the Y axis is matched by operating the fine right and left moving device 4. Now, the position in the Y axis direction, that is, the vertical position of the press plate material 1 will be locked by the Y axis locking lever 11. When three of the register marks of the press plate material 1 are matched by three of the register marks of the ground paper, the space between the press plate material 1 and the board is made vacuum tight through the vacuum suction holes 13 by an attached vacuum pump (not shown) to thereby fix the press plate material on the loading table 18. Then a pair of U-shaped buffer holes are punched in it by the punching mechanism 14, 14'. The punched U-shaped chip is pushed out through its U-shaped hole, dropped downwardly and drawn by said vacuum to be gathered at the lower portion of the table 19.

After the completion of the above described procedures on the press plate material 1 for all the necessary colors, typically four colors, the preparation work to install the body of a printing machine with the press plate are completed.

Figure 4A:
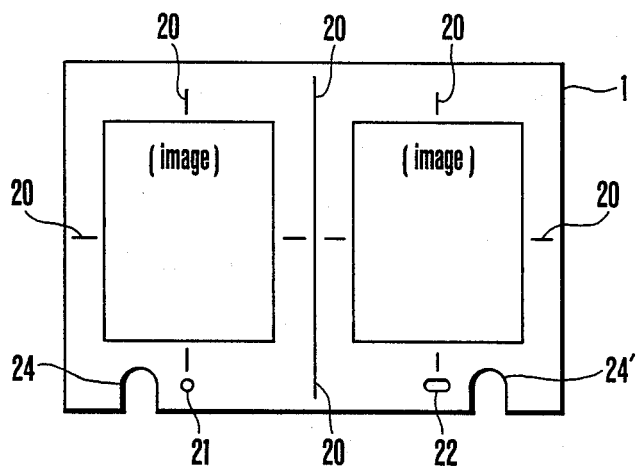
FIG. 4(A) illustrates a press plate in the present invention, and FIG. 4(B) through 4(D), respectively, illustrate a number of different shaped U-shaped holes.
Figure 4B:
Figure 4C:
Figure 4D:

FIG. 4(A) is a view illustrating the press plate material for two duplicate printings after pin holes 21, 22 and U-shaped holes 24, 24' are punched therein and register marks 20 are drawn thereon, and FIGS. 4(B) and 4(D) illustrate various alternative shaped of U-shaped holes 24, 24', respectively. A pair of U-letter-like shaped U-shaped holes 24, 24' are punched on the lower edge of the press plate material 1. Such U-shaped holes 24, 24' typically have a width of 10 mm, a height of 112 mm and a radius of 5 mm at its top portion. Since U-shaped buffer pins are provided in the vice 25 attached to the body 27 of the printing machine, the buffer pints of the printing machine are fitted into the U-shaped holes of the press plate material by merely sliding the lower edge of the press plate material 1 on the U-shaped buffer pins, and accordingly the press plate material 1 can be easily set on the body 27 of the printing machine while registering precisely at the same time. The time consuming works that is not even accomplished with accuracy, including, after the pin holes of the press plate material 1 are matched with the pin holes provided on the vice 25 of the body 27 of the printing machine, inserting pins into such pin holes one by one, as is done in the prior art, become unnecessary. Since the recent trend in the printing business is to require many varieties of printing with fewer numbers of printed copies, the press plate material is exchanged frequently, so that the importance of the present invention, which provides an apparatus wherein one press plate material can be simply exchanged for another in the printing machine, is extremely great. FIG. 4(B) shows the U letter-like-shaped U-shaped holes, while FIGS. 4(C) and 4(D) show the corners of U-shaped holes having cut corners and rounded corners, respectively.

As described above in detail, the advantageous results of the present invention are summarized as follows. (1) In the prior art, it takes much more times and the accuracy of printing is very low since color shearing of the images due to slight discrepancies in printed register marks are eliminated by properly registering the register marks at the time the press plate is set on the body of the multicolor printing machine. However, in the present invention, discrepancy of location of the register marks of the press plate material for each color in the multicolor printing is able to be limited to within almost 2/100 mm and therefore color shearing of the images can be nearly eliminated and multicolor printing with high accuracy of printing can be realized since the distance from the center of the pin holes to the left and right register marks can be precisely given for each press plate material and further the upper and lower register marks are able to be located precisely on the center line of the pin holes. (2) At the present time the press plate material of a printing machine has to be exchanged frequently every day. In the prior art, it takes twenty to thirty minutes to start regular printing for each item of printed matter, since the locations of register mark of the press plate material for each color must be matched many times by matching their register marks every time there is an exchange of press plate material in order to execute a trial printing. However, in the present invention, the registering time for each press plate material can be significantly reduced since the color shears of images on printing can be eliminated by only one registration of the press plate materials to thereby initiate regular printing on the multicolor printing machine. Accordingly, operational efficiency of the multicolor printing machine, which machine requires an exchange of press plate materials more than 100 times a day may be significantly improved. (3) In the prior art, several hundred sheets of paper are required for trial printing in order to match the images of each press plate material for multicolor printing before regular printing can be started for each press plate material. Furthermore, extensive amounts of trial sheets of paper are also needed in a printing shop in which a number of multicolor printing machines are utilized since a printing machine usually prints between, approximately 150 to 200 plates. In the present invention, since only a few trial sheets of paper are needed for each item of printed matter before regular multicolor printing is started, the printing costs are remarkably reduced.

The invention being best described, it will be obvious that the same may be varied in many ways. Such variations are not to be regarded as a departure from the spirit and scope of the invention and all such modification as would be obvious to one skilled in the art are intended to be included within the scope of the following claims.

We claim:

1. An apparatus for matching the register marks an punching U-shaped holes for a press plate, said apparatus comprising:
   a press plate material loading table positioned on a base for loading a press material, its lower edge being positioned on said loading table,
   a pin hole positioning mechanism for supporting the lower edge of said press plate material to position said press plate material at a predetermined pin hole location from said lower edge,
   a press plate material centering mechanism for centering the center of said press plate material in the horizontal material at a predetermined pin hole location from said lower edge,
   a press plate material centering mechanism for centering the center of said press plate material in the horizontal direction on said press plate material loading table,
   register mark location reading means overhung from the upper edge of said press plate material loading table so as to be able to be moved and finely adjusted in the horizontal and vertical directions and locked at a desired location, for reading register marks on said press plate material,
   a press plate material horizontal and vertical feed mechanism with a horizontal fine adjustment mechanism and a vertical fine adjustment mechanism for adjusting said press plate material in the horizontal and vertical direction, respectively, to match location of register marks of said press plate material,
   a press plate locking means, for vacuum contacting and releasing said press plate material through a plurality of air suction holes provided on said press plate material loading table,
   an automatic U-shaped hole punching mechanism with one to six parts of punches which have different pitches, for punching a pair or two pairs of U-shaped holes of predetermined pitches on said press plate material automatically, and
   an operation device, connected electrically to said horizontal fine adjustment mechanism, said vertical fine adjustment mechanism and said automatic U-shaped hole punching mechanism, for controlling the operation of each mechanism.

2. An apparatus as claimed in claim 1, wherein said register mark location reading device comprises a device which includes a projector having a focus control function for projecting the register marks printed on said press plate material on a plane.

3. An apparatus as claimed in claim 1 or 2, wherein said register mark location reading device comprises a charge-coupled device type detector having a monitor display for register marks.

4. An apparatus as claimed in claim 1 or 2, wherein said register mark location reading means has a manually operated X axis moving lever, X axis locking lever as a horizontal moving and locking mechanism and a manually operated Y axis moving lever, Y axis fine adjustment dial and Y axis locking lever as a vertical moving and locking mechanism.

5. An apparatus as claimed in claim 1 or 2, wherein said horizontal fine adjustment mechanism and said vertical fine adjustment mechanism of said press plate material horizontal and vertical feed mechanism includes a stepping motor respectively.

* * * * *